United States Patent
Chiang et al.

(10) Patent No.: US 8,252,633 B2
(45) Date of Patent: Aug. 28, 2012

(54) SUBASSEMBLY THAT INCLUDES A POWER SEMICONDUCTOR DIE AND A HEAT SINK HAVING AN EXPOSED SURFACE PORTION THEREOF

(75) Inventors: Wan-Lan Chiang, Taipei (TW); Kuang Hann Lin, Taipei (TW); Chih-Ping Peng, Taipei (TW)

(73) Assignee: Vishay General Semiconductor LLC, Hauppauge, NY (US)

( * ) Notice: Subject to any disclaimer, the term of this patent is extended or adjusted under 35 U.S.C. 154(b) by 0 days.

(21) Appl. No.: 13/031,658

(22) Filed: Feb. 22, 2011

(65) Prior Publication Data

US 2011/0171784 A1    Jul. 14, 2011

Related U.S. Application Data

(62) Division of application No. 11/827,592, filed on Jul. 12, 2007, now Pat. No. 7,915,728.

(51) Int. Cl.
*H01L 21/00* (2006.01)

(52) U.S. Cl. ........... 438/122; 257/E23.04; 257/E21.505; 257/707

(58) Field of Classification Search .................... 438/122
See application file for complete search history.

(56) References Cited

U.S. PATENT DOCUMENTS

| | | |
|---|---|---|
| 5,216,278 A | 6/1993 | Lin et al. |
| 5,311,060 A | 5/1994 | Rostoker et al. |
| 6,134,776 A * | 10/2000 | Hoffmeyer ..................... 29/840 |
| 6,587,344 B1 | 7/2003 | Ross |
| 7,196,415 B2 | 3/2007 | Zhong et al. |
| 2004/0113263 A1* | 6/2004 | Wu .............................. 257/706 |
| 2005/0230816 A1 | 10/2005 | Kurauchi et al. |
| 2006/0081978 A1 | 4/2006 | Huang et al. |
| 2006/0249835 A1 | 11/2006 | Miyauchi et al. |

FOREIGN PATENT DOCUMENTS

| | | |
|---|---|---|
| CN | 1549337 A | 11/2004 |
| DE | 4400341 A1 | 7/1994 |
| EP | 1729341 A2 | 12/2006 |

* cited by examiner

*Primary Examiner* — Ajay K Arora
(74) *Attorney, Agent, or Firm* — Mayer & William P.C.; Karin L. Williams; Stuart H. Mayer

(57) ABSTRACT

The semiconductor assembly includes a first subassembly having a heat sink. Solder material is disposed on the exposed portion of a first surface of heat sink. A power semiconductor die is located on the first surface of the heat sink and is thermally coupled thereto by the solder material. A packaging patterned polymer layer is disposed on a second surface of the heat sink opposing the first surface and defines an interior surface portion of the heat sink. A semiconductor package is provided in which the first subassembly, solder material and die are located such that the interior surface portion of the second surface of the heat sink is not enclosed by the semiconductor package.

10 Claims, 12 Drawing Sheets

SUBASSEMBLY THAT INCLUDES A POWER SEMICONDUCTOR DIE AND A HEAT SINK HAVING AN EXPOSED SURFACE PORTION THEREOF

CROSS REFERENCE TO RELATED APPLICATION

The present application is a divisional of U.S. patent application Ser. No. 11/827,592, filed on Jul. 12, 2007, the contents of which are incorporated herein by reference.

This application is also related to U.S. patent application Ser. No. 11/827,593, now U.S. Pat. No. 7,838,985, entitled "Semiconductor Assembly that Includes a Power Semiconductor Die Located on a Cell Defined by first and Second Patterned Polymer Layers," and U.S. patent application Ser. No. 12/939,561, filed Nov. 4, 2010 and entitled "Semiconductor Assembly that Includes a Power Semiconductor Die Located on a Cell Defined by first and Second Patterned Polymer Layers," both of which are incorporated herein by reference in its entirety.

FIELD OF THE INVENTION

The present invention relates to mounting assemblies and packages for semiconductor devices used in electronic equipment, and more particularly to mounting assemblies and packages power semiconductor devices.

BACKGROUND OF THE INVENTION

The electronics industry has been progressing with the miniaturization of electronic devices. This trend influences semiconductor packaging technology, which enables the connection between bare IC chips and other components, and enables the connection between bare IC chips and other components. Typically, a semiconductor package has a footprint much larger than that of the chip. To adapt to the miniaturization trend, the size difference between the package and the chip has been reduced, producing a new package type called a Chip scale package (CSP). A chip scale package is loosely defined as a package that takes no more than about 20% additional area (length and width) than the bare silicon die. The solder balls of chip scale packages are smaller than ball grid array (BGA) that had arranged according to international standard of Joint Electron Device Engineering Council (JEDEC). When it comes to personal and portable electronic devices, smaller is better, and various products need different chip scale package types, a wide array of which are currently available.

Certain semiconductor devices are designed to handle relatively high voltages in a compact space. For example, semiconductor devices that are exposed to RMS voltages greater than 100 VAC, such as 265 VAC or 415 VAC, are often mounted in electronic power supplies and the like. These devices may dissipate relatively large amounts of power, and are accordingly often mounted to heat sinks or like devices as well as being electrically connected to electronic equipment of various types.

Many such semiconductor devices for power applications are commonly available in the JEDEC standard TO-220 and DO-218 packages (www.jedec.org). An illustrative TO-220 package 110 is shown in FIG. 1. The TO-220 package 110 includes a pressure clamp 140, retainer 130, heat sink 120, a spacer 150 interposed between the package 110 and the heat sink 120, and a semiconductor die (not visible in FIG. 1) with leads 114 exiting the package 110 on one side. High-voltage semiconductor devices may also be available in various other packages similar to the TO-220 package.

The continued emphasis on faster, smaller, lighter, and lower cost electronics systems is making component, board and system packaging more complex each year. The increase in complexity is due to wider use of finer pitch and thinner array surface mount packages, which are the key to miniaturization of electronics products. Most of the components on a typical systems motherboard for desk top computer systems remain at 1.27 and 1.00 mm pitch surface mount components with increasing use of finer pitch (0.80, 0.65, 0.50 & 0.40 mm) array styled packages. Portable systems are moving to the finer pitches at a faster rate. The component pitch and overall profile height plays a critical role in the complexity of manufacturing process. The use of finer pitch, low profile components demands assembly equipment and processes that operate with tighter specification limits. The assembly processes that demand a higher precision include: pick-and-place, solder paste-printing applications, reflow, inspection, and rework. The use of finer pitch low profile components increases the complexity, which could negatively effect yield and rework making assemblies more difficult and costly.

One aspect of the packaging process that can reduce yield is the accuracy with which the semiconductor die can be mounted to the heat sink or slug. The accuracy of this process relies primarily on the pick and place machine that is employed. In addition, another packaging aspect of the packaging process that can also reduce yield is the accuracy with which the solder thickness can be controlled.

SUMMARY OF THE INVENTION

In accordance with the present invention, a semiconductor assembly is provided. The semiconductor assembly includes a first subassembly having a heat sink. Solder material is disposed on the exposed portion of a first surface of heat sink. A power semiconductor die is located on the first surface of the heat sink and is thermally coupled thereto by the solder material. A packaging patterned polymer layer is disposed on a second surface of the heat sink opposing the first surface and defines an interior surface portion of the heat sink. A semiconductor package is provided in which the first subassembly, solder material and die are located such that the interior surface portion of the second surface of the heat sink is not enclosed by the semiconductor package.

In accordance with one aspect of the invention, the semiconductor assembly may also include a semiconductor package in which the first subassembly, solder and die are located.

In accordance with another aspect of the invention, the semiconductor package may be is a chip scale package.

In accordance with another aspect of the invention, at least one of the first and second patterned polymer layers may include polyimide.

In accordance with another aspect of the invention, the power semiconductor die may have a footprint with a given shape and the first patterned polymer layer conforms to the given shape.

In accordance with another aspect of the invention, the semiconductor assembly may also include a second subassembly. The second subassembly may include a second heat sink and a third patterned polymer layer disposed on a surface of the second heat sink to define an exposed portion of the surface. The exposed portion of the surface extends radially inward along the second heat sink surface from the third layer. The second subassembly also includes a fourth patterned polymer layer disposed on a radially outer portion of the third patterned polymer layer The third and fourth layers define a cell for accommodating a power semiconductor die. A second solder material is disposed on the exposed portion of the second heat sink surface. The power semiconductor die is further located within the cell on a radially inward portion of the third layer and thermally coupled to the second heat sink by the second solder material.

In accordance with another aspect of the invention, a semiconductor assembly is provided that includes a heat sink and a first patterned polymer layer disposed on a surface of the heat sink to define an exposed portion of the first surface. The exposed portion of the first surface extends radially inward along the heat sink surface from the first layer. Solder material is disposed on the exposed portion of the heat sink surface and a power semiconductor die is located on the first patterned layer and thermally coupled to the heat sink by the solder material.

DETAILED DESCRIPTION

The present invention provides a mounting system for a semiconductor device that overcomes the aforementioned limitations of prior-art mounting systems. The mounting system is particularly suitable for use with discrete power semiconductor devices such as those employed for power linear and switching applications. Examples of such devices include, without limitation, resistors, rectifiers, transistors and the like. The mounting system discussed herein may be used in connection with surface mount technology packages such as chip scale packages, for example. Examples of standardized packages that may be suitable include, without limitation, JEDEC TO-220 and DO-218 packages. In the detailed description that follows, like element numerals are used to identify like elements appearing in one or more of the figures.

Figure 1:
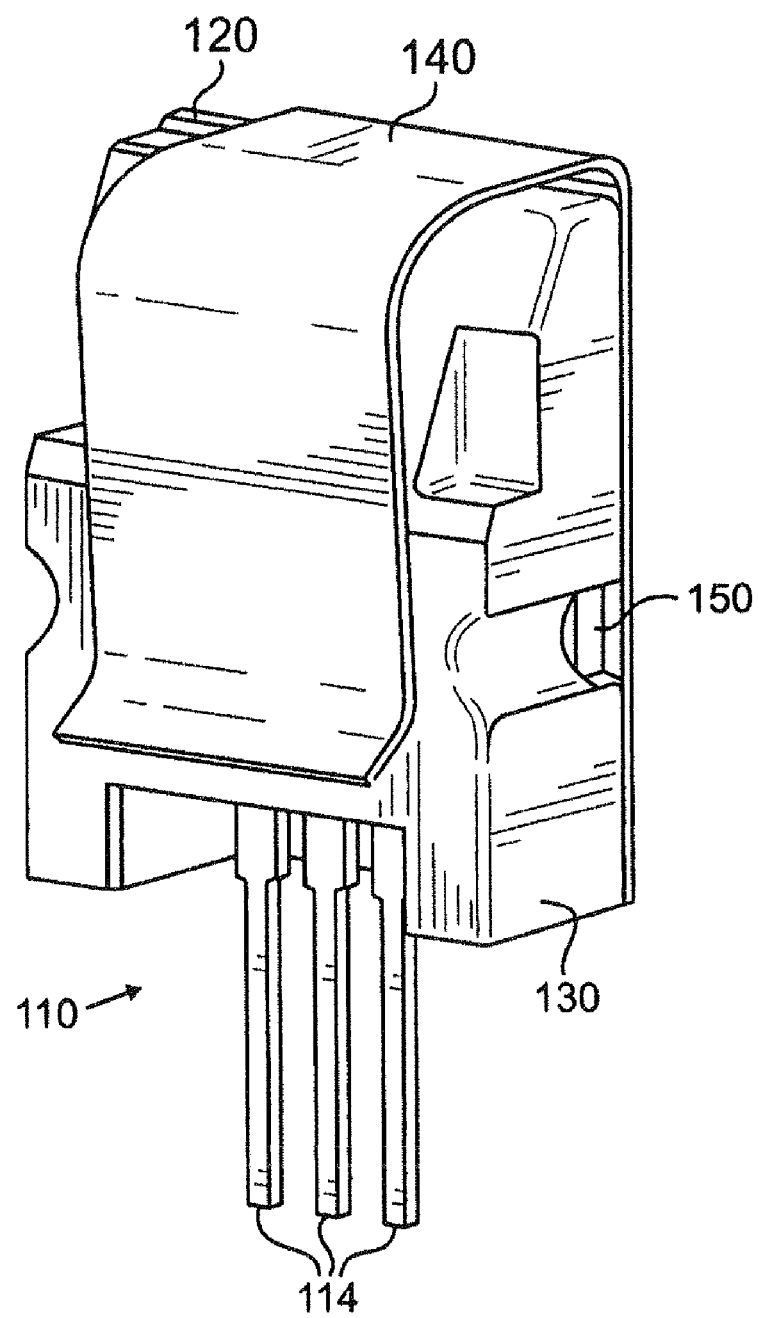
FIG. 1 shows an illustrative package for a power semiconductor die.
Figure 2A:
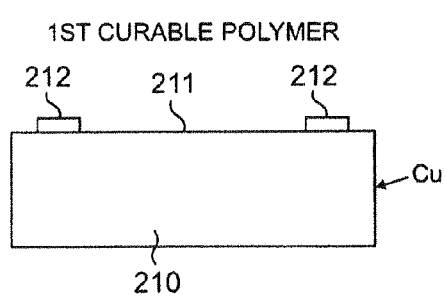
FIGS. 2(a) and 2(b) show cross-sectional and top views, respectively, of a first heat sink that is to be mounted to a semiconductor die and a first patterned polymer layer formed on the heat sink.
Figure 2B:
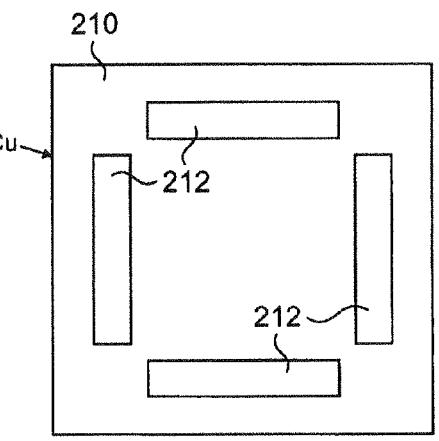
Figure 3A:
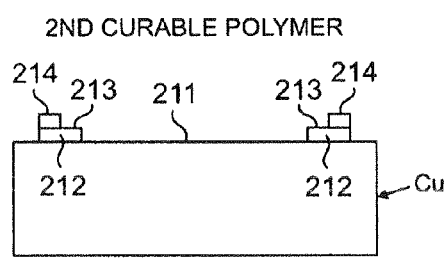
FIGS. 3(a) and 3(b) show cross-sectional and top views, respectively, of the patterned polymer layers formed on the first heat sink.
Figure 3B:
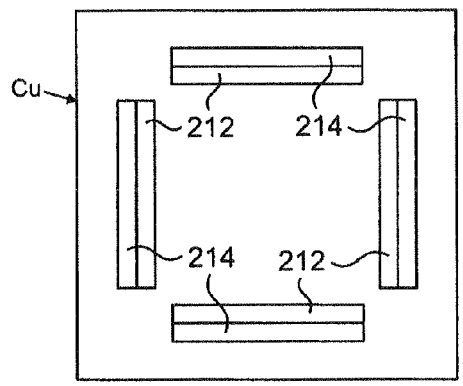
Figure 4A:
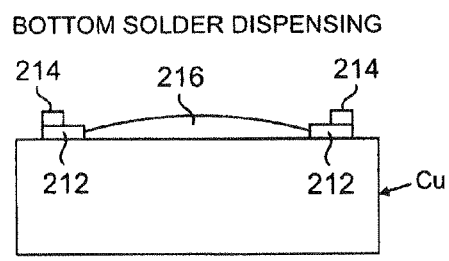
FIGS. 4(a) and 4(b) show cross-sectional and top views, respectively, of a solder material located on the surface of the first heat sink.
Figure 4B:
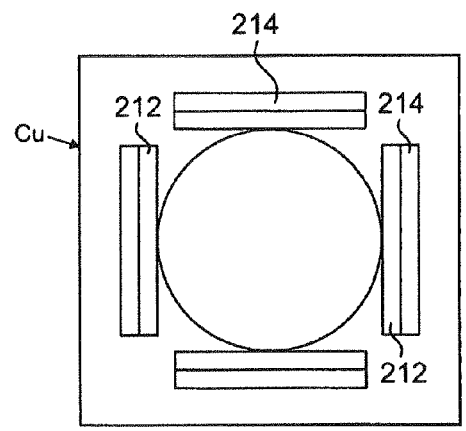
Figure 5A:
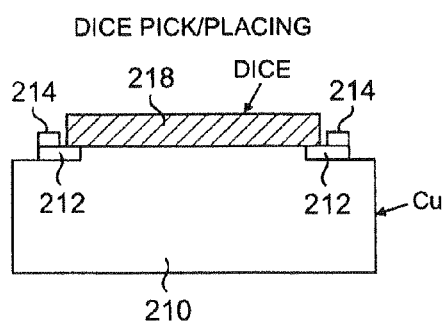
FIGS. 5(a) and 5(b) show cross-sectional and top views, respectively, of a power semiconductor die positioned on the first heat sink and contacting one of the patterned polymer layers.
Figure 5B:
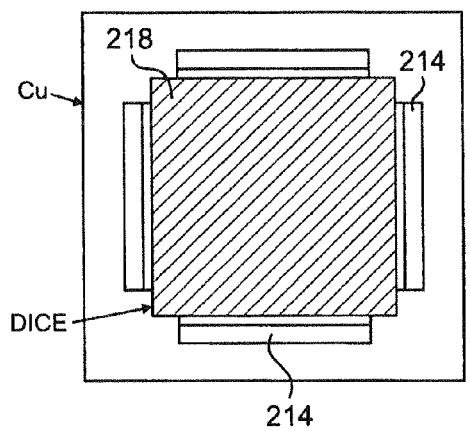

FIGS. 2(a) and 2(b) show cross-sectional and top views, respectively, of a first heat sink 210 that is to be mounted to a semiconductor die. The heat sink 210 may be formed from any suitable thermally conductive material such a, but not limited to, Cu, Al and alloys thereof. In accordance with the present invention, a curable polymer is applied to an upper surface of the first heat sink 210 and patterned using well-known stenciling and screening techniques to form a first patterned polymer layer 212. Suitable polymers include, without limitation, polyimide, silicon rubber, and fluoroelastomer. The first patterned polymer layer 212 defines sidewalls of a cell 211 in which the solder can be placed. Next, in FIGS. 3(a) and 3(b), a second patterned polymer layer 214 is formed over the first polymer layer 212, again using well-known stenciling and screening techniques. The second patterned polymer layer 214 defines a border within which the die is to be situated. Exposed portions 213 of the first patterned layer 212 (i.e., those portions not covered by the second patterned layer 214) define surfaces on which the die ultimately can be mounted. As shown in FIGS. 4(a) and 4(b), after formation of the first and second patterned polymer layers, solder 216 is dispensed in a conventional manner using a syringe, for example, onto the heat sink 210 into the cell 211 that is defined by the first patterned layer 212. In FIG. 5 a pick and place assembly machine or robot is used to position the semiconductor die 218 onto the exposed portion 213 of the first patterned layer 212. The border of the second patterned layer 214 facilitates accurate placement and alignment of the die on the heat sink 210.

Figure 6A:
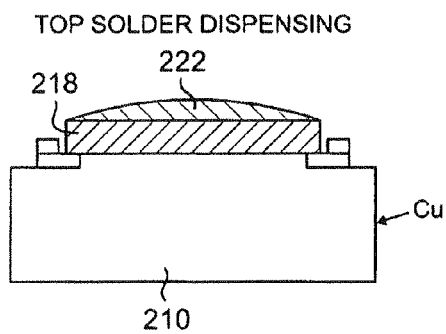
FIGS. 6(a) and 6(b) show cross-sectional and top views, respectively, of solder material applied to the exposed surface of the semiconductor die.
Figure 6B:
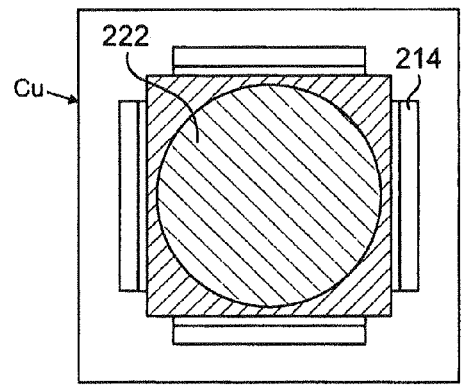
Figure 7A:
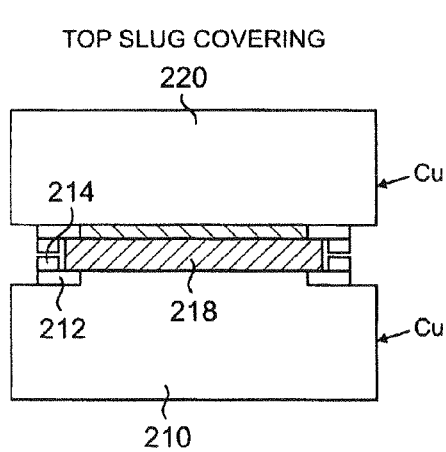
FIGS. 7(a) and 7(b) show cross-sectional and top views, respectively, of the final semiconductor assembly that includes the semiconductor die mounted to two heat sinks.
Figure 7B:
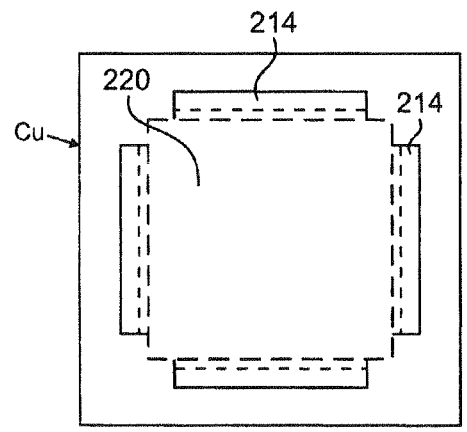

The process depicted in FIGS. 2-5 may be repeated for a second heat sink that is to contact the side of the die 218 opposing the first heat sink 210. In this case a second heat sink 220 first undergoes the process steps depicted in FIGS. 2-4 to form first and second patterned layers 212 and 214 on a second heat sink 220. Next, as shown in FIGS. 6(a) and 6(b), solder 222 is dispensed onto the exposed surface of the die 218. The second heat sink subassembly (i.e., heat sink 220 with patterned layers 212 and 214 located thereon) is then positioned over the die 218 so that the die 218 contacts the exposed surface portion of the second patterned layer 212 of the second heat sink subassembly. FIGS. 7(a) and 7(b) show cross-sectional and top views, respectively, of the final semiconductor assembly that includes the semiconductor die mounted to two heat sinks.

A number of advantages arise from the use of the mounting process depicted in FIGS. 2-7. For example, the use of a second patterned layer (e.g., second patterned layer 214) to constrain the position of the die on the heat sink limits rotational and out-of plane misalignments of the die. In this way the second patterned layer actively cooperates with the pick and place assembly machine to assist in the placement process and, as a result, the pick and place assembly machine is not solely responsible for placement of the die. In addition, the use of a first patterned layer (e.g., first patterned layer 212) that directly contacts the heat sink allows precise control of the overall solder thickness and thickness uniformity. For instance, in some cases the solder thickness in the final package can be maintained within a tolerance of about 0.25 mil to 3 mil. In addition, because the polymer that forms the first and second patterned layers is generally relatively soft and pliable, the level of stress exerted upon the die can be reduced.

To illustrate the advantages of the present invention, three samples were manufactured in accordance with the technique discussed above. The solder thickness of the samples were selected to be 55 microns, 65 microns and 75 microns, respectively. The 55 micron sample was found to vary in thickness between about 52.8 microns and 54.6 microns. The 65 micron sample was found to vary in thickness between about 64.5 microns and 69.2 microns. The 75 micron sample was found to vary in thickness between about 74.4 microns and 79.2 microns.

The size and shape of the cells 211 defined by the first and second patterned layers is not limited to those depicted in FIGS. 2-7. Rather, the size and shape of the cells can be selected as desired for different die geometries or footprints (e.g., square, hexagonal, round). The cell configuration may also be selected to comply with other factors such as flux overflow, the prevention of shorts and the like. Moreover, the sidewalls of the patterned layers 212 and 214 are not limited to the four linear segments of polymer for each of the two patterned layers that are depicted in FIGS. 2-7. Rather, any suitable configuration and number of polymer segments may be employed. For example, a square, rectangular or circular cell can be defined by a single continuous segment of polymer that has a shape defining a square, rectangle or circle, respectively. Alternatively, multiple continuous or non-continuous polymer segments may be employed in any number that is desired.

In the embodiments of the invention presented above one patterned polymer layer (e.g., patterned layer 214) is employed to constrain or control the x-y position of the die on the surface of the heat sink 210 and a second patterned polymer layer (patterned layer 212) is used to control the thickness of the solder in the z-direction. In other embodiments of the invention only one polymer layer is employed to control either the x-y position of the die or the thickness of the solder in the z-direction.

Figure 8A:
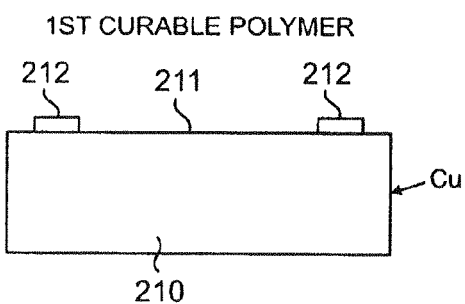
FIGS. 8(a) and 8(b) show cross-sectional and top views, respectively, of a first heat sink that is to be mounted to a semiconductor die and a first patterned polymer layer formed on the heat sink when only the x-y position of the die is to be constrained by the polymer.
Figure 8B:
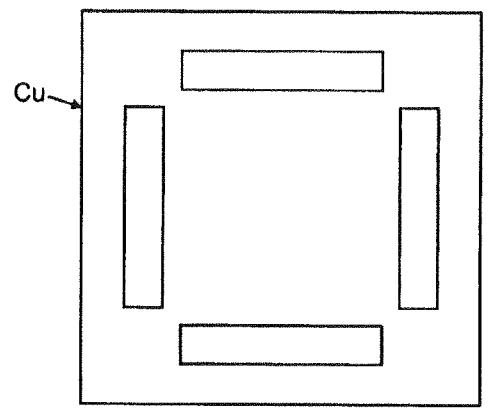
Figure 9A:
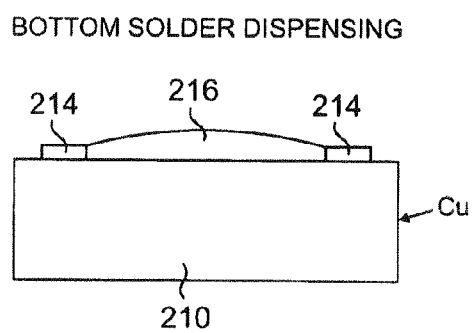
FIGS. 9(a) and 9(b) show cross-sectional and top views, respectively, of a solder material located on the surface of the first heat sink depicted in FIGS. 8(a) and 8(b).
Figure 9B:
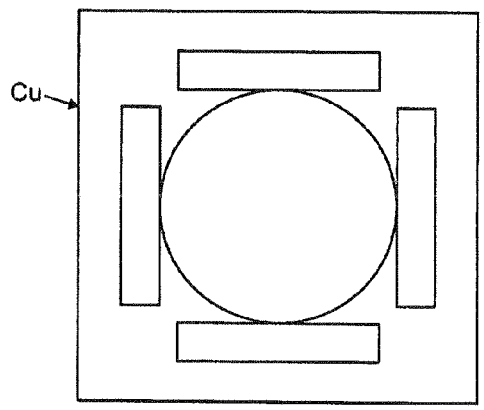
Figure 10A:
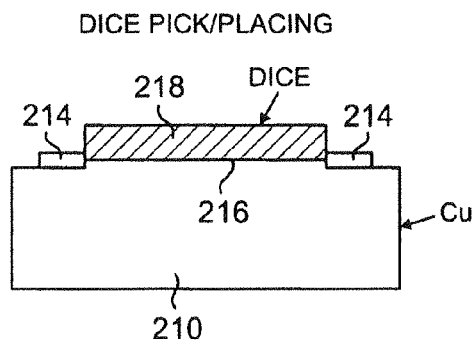
FIGS. 10(a) and 10(b) show cross-sectional and top views, respectively, of a power semiconductor die positioned on the first heat sink depicted in FIGS. 9(a) and 9(b)
Figure 10B:
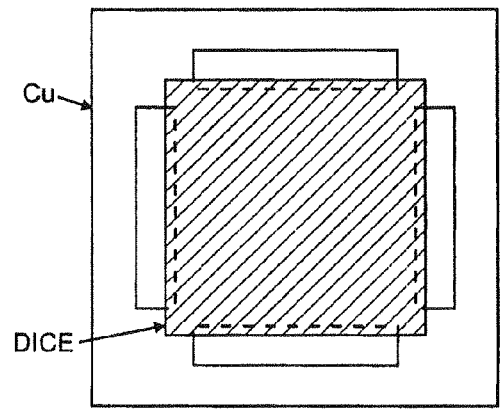

FIGS. 8-10 show an embodiment of the invention in which only a single polymer layer is employed to constrain or control the x-y position of the die on the surface of the heat sink. As shown in FIGS. 8(a) and 8(b), which once again show cross-sectional and top views, respectively, of the heat sink 210, a curable polymer is applied to an upper surface of the first heat sink 210 and patterned using well-known stenciling and screening techniques to form an orienting patterned polymer layer 214 that is used to constrain or control the x-y position of the die. The orienting layer 214 defines sidewalls of a cell 211 in which the solder can be placed. Next, in FIGS. 9(a) and 9(b), solder 216 is dispensed in a conventional manner using a syringe, for example, onto the heat sink 210 into the cell 211 that is defined by the orienting patterned layer 214. In FIGS. 10(a) and 10(b), a pick and place assembly machine or robot is used to position the semiconductor die 218 into the cell 211 so that it contacts the solder 216. The border of the orienting patterned layer 214 facilitates accurate placement and alignment of the die 218 on the heat sink 210.

Figure 11A:
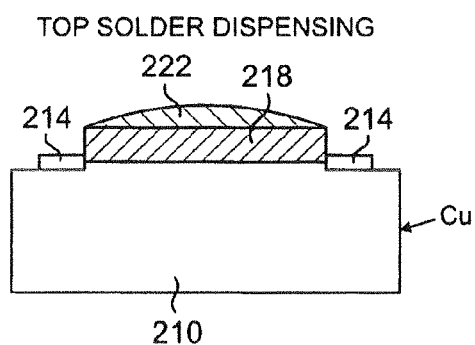
FIGS. 11(a) and 11(b) show cross-sectional and top views, respectively, of solder material applied to the exposed surface of the semiconductor die depicted in FIGS. 10(a) and 10(b)
Figure 11B:
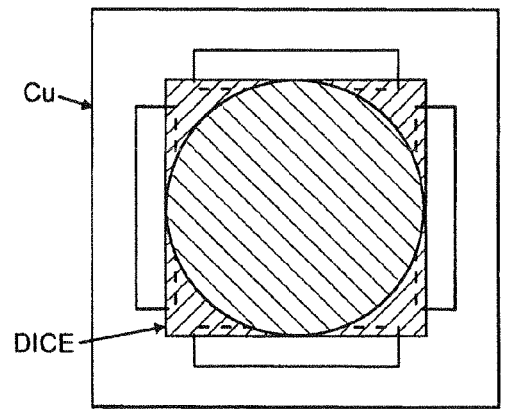
Figure 12A:
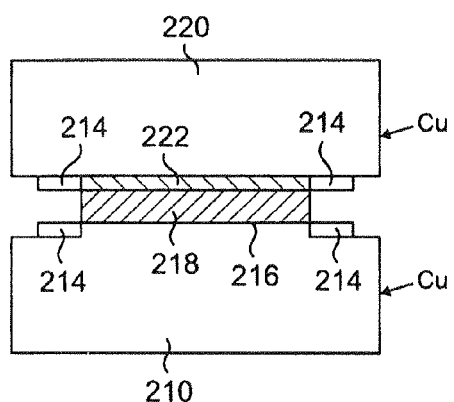
FIGS. 12(a) and 12(b) show cross-sectional and top views, respectively, of the final semiconductor assembly that includes the semiconductor die mounted to the two heat sinks referred to in connection with FIGS. 8-11.
Figure 12B:
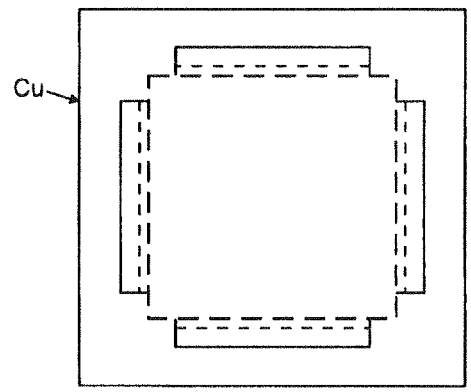

The process depicted in FIGS. 8-10 may be repeated for a second heat sink that is to contact the side of the die 218 opposing the first heat sink 210. In this case a second heat sink 220 first undergoes the process steps depicted in FIGS. 8-9 to form the orienting patterned layer 214 on a second heat sink 220. Next, as shown in FIGS. 11(a) and 11(b), solder 222 is dispensed onto the exposed surface of the die 218. The second heat sink subassembly (i.e., heat sink 220 with orienting patterned layer 214 located thereon) is then positioned over the die 218 so that the die 218 is located within the cell defined by the orienting patterned layer 214 of the second heat sink subassembly. The die 218 contacts the solder 222 of the second heat sink assembly to form the complete semiconductor assembly depicted in FIG. 12.

Figure 13A:
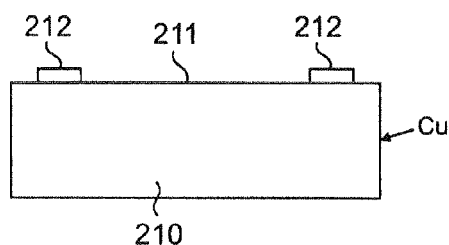
FIGS. 13(a) and 13(b) show cross-sectional and top views, respectively, of a first heat sink that is to be mounted to a semiconductor die and a first patterned polymer layer formed on the heat sink when only the solder thickness is to be controlled by the polymer.
Figure 13B:
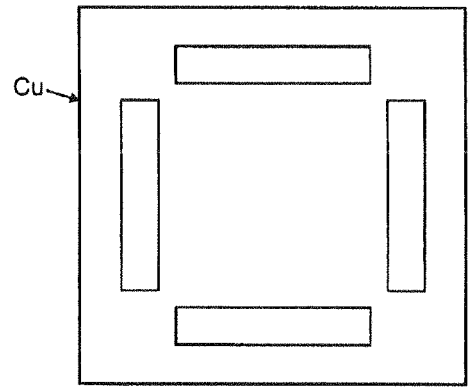
Figure 14A:
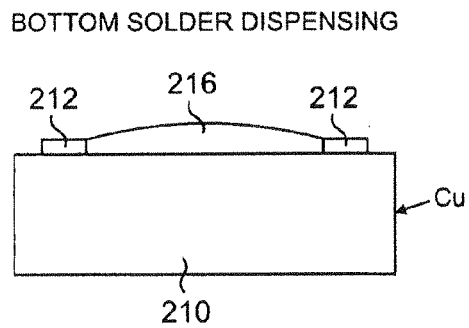
FIGS. 14(a) and 14(b) show cross-sectional and top views, respectively, of a solder material located on the surface of the first heat sink depicted in FIGS. 13(a) and 13(b).
Figure 14B:
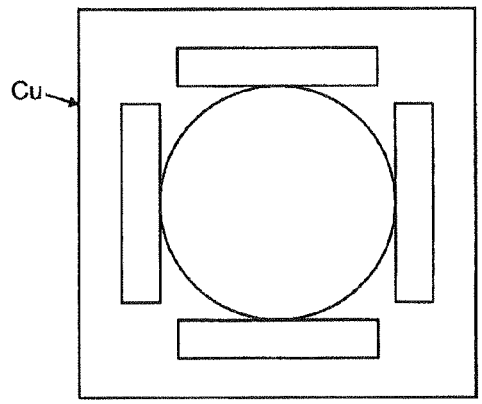
Figure 15A:
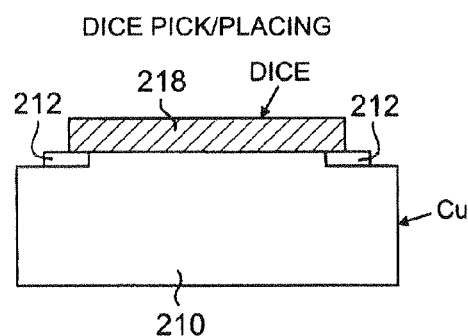
FIGS. 15(a) and 15(b) show cross-sectional and top views, respectively, of a power semiconductor die positioned on the first heat sink depicted in FIGS. 14(a) and 14(b)
Figure 15B:
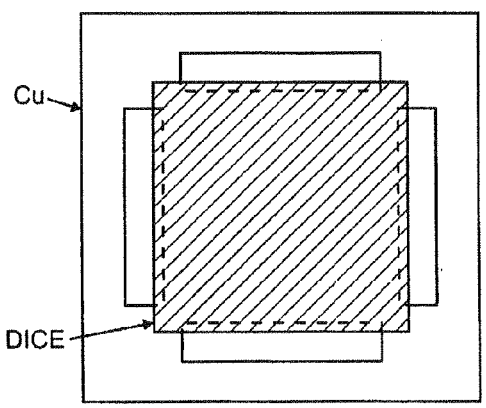

FIGS. 13-15 show an embodiment of the invention in which only a single polymer layer is employed to control the overall thickness and thickness uniformity of the solder in the z-direction. As shown in FIGS. 13(a) and 13(b), which once again show cross-sectional and top views, respectively, of the heat sink 210, a curable polymer is applied to an upper surface of the first heat sink 210 and patterned using well-known stenciling and screening techniques to form a thickness-controlling patterned polymer layer 212 that is used to control the thickness of the solder in the z direction. Next, in FIG. 14(a) and 14(b), solder 216 is dispensed in a conventional manner using a syringe, for example, onto the heat sink 210 into the cell 211 that is defined by the thickness-controlling patterned layer 212. In FIGS. 15(a) and 15(b) a pick and place assembly machine or robot is used to position the semiconductor die 218 onto the thickness-controlling layer 212.

Figure 16A:
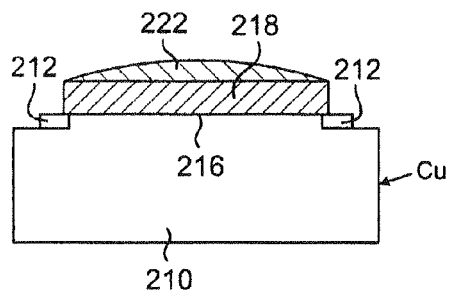
FIGS. 16(a) and 16(b) show cross-sectional and top views, respectively, of solder material applied to the exposed surface of the semiconductor die depicted in FIGS. 15(a) and 15(b)
Figure 16B:
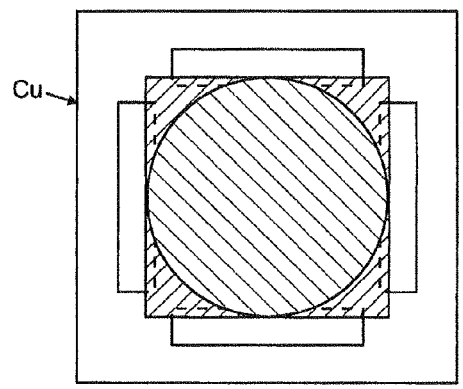
Figure 17A:
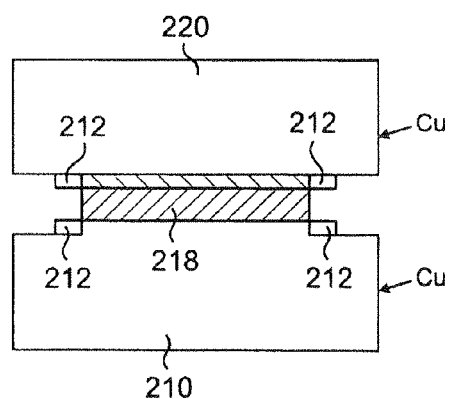
FIGS. 17(a) and 17(b) show cross-sectional and top views, respectively, of the final semiconductor assembly that includes the semiconductor die mounted to the two heat sinks referred to in connection with FIGS. 13-16.
Figure 17B:
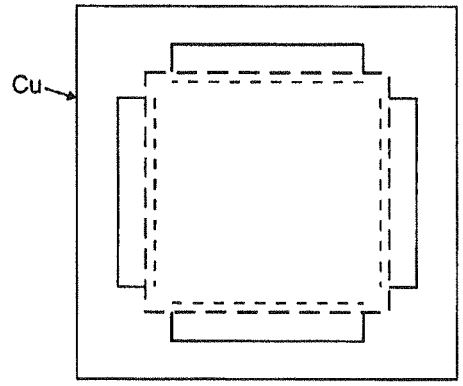

The process depicted in FIGS. 13-15 may be repeated for a second heat sink that is to contact the side of the die 218 opposing the first heat sink 210. In this case a second heat sink 220 first undergoes the process steps depicted in FIGS. 13-14 to form the thickness-controlling patterned layer 212 on a second heat sink 220. Next, as shown in FIGS. 16(a) and 16(b), solder 222 is dispensed onto the exposed surface of the die 218. The second heat sink subassembly (i.e., heat sink 220 with thickness-controlling patterned layer 212 located thereon) is then positioned over the die 218 so that the die 218 is located on the thickness-controlling patterned layer 212 of the second heat sink subassembly. The die 218 contacts the solder 222 of the second heat sink assembly to form the complete assembly depicted in FIG. 17.

Once the final semiconductor assembly has been completed as in FIGS. 7(*a*) and 17(*a*), the assembly is generally encapsulated using a molding compound. The molding compound, however, inhibits the dissipation of heat from the heat sinks 210 and 220. This problem can overcome by exposing one or more portions of the heat sinks in the manner described below.

Figure 18A:
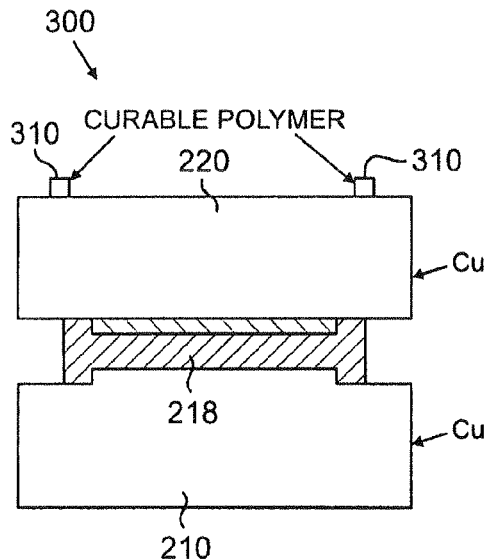
FIGS. 18a and 18b show cross-sectional and top views, respectively, of the semiconductor assembly that will be encapsulated by a semiconductor housing.
Figure 18B:
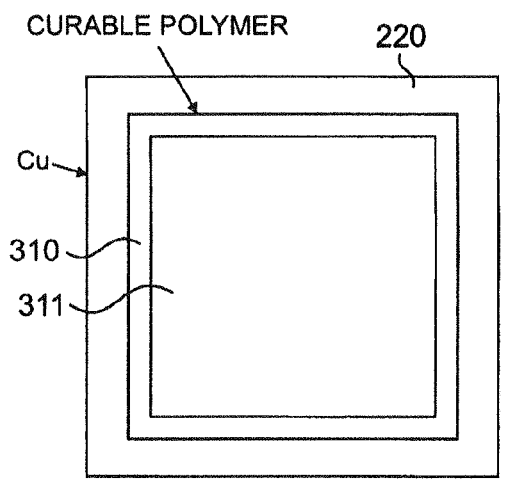
Figure 19A:
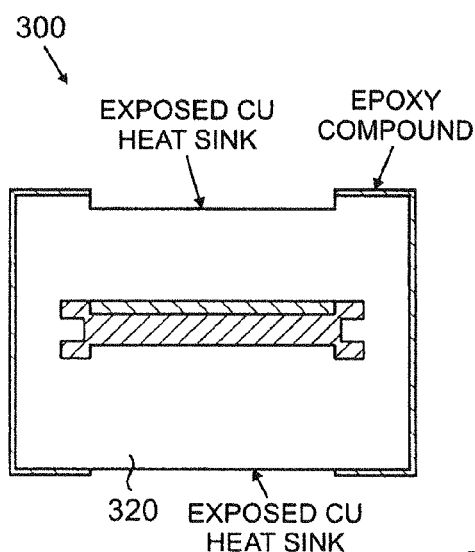
FIGS. 19a and 19b show the molding compound applied around the semiconductor assembly.
Figure 19B:
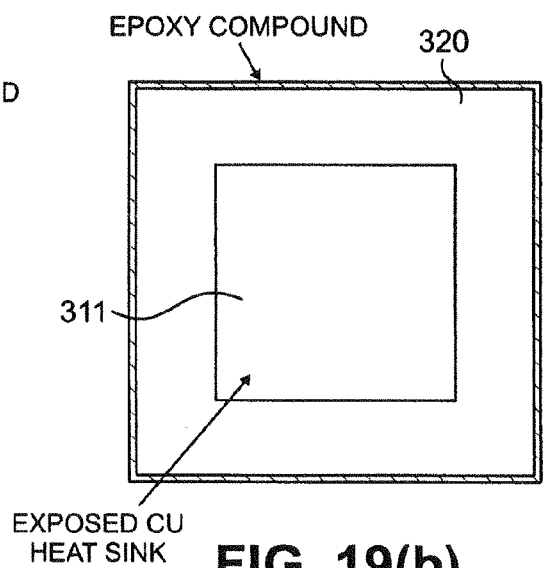

FIGS. 18(*a*) and 18(*b*) show cross-sectional and top views, respectively, of the semiconductor assembly 300. In accordance with the present invention, a curable polymer is applied to the outer surface of the top heat sink 220 (i.e., the surface of the heat sink 220 remote from the die 218) and patterned using well-known stenciling and screening techniques to form the patterned polymer layer 310. Suitable polymers include, without limitation, polyimide, silicon rubber, and fluoroelastomer. The patterned polymer layer 310 defines sidewalls of a cell 311. Next, as shown in FIGS. 19(*a*) and 19(*b*) a molding compound 320 is applied around the semiconductor assembly 300, typically using an injection molding process. The patterned polymer layer 310 allows the outer surface of the top heat sink 220 within cell 311 to remain exposed after molding without having compound flash problems arise. By molding the semiconductor assembly in this manner dice pressing stresses are also reduced.

Figure 20A:
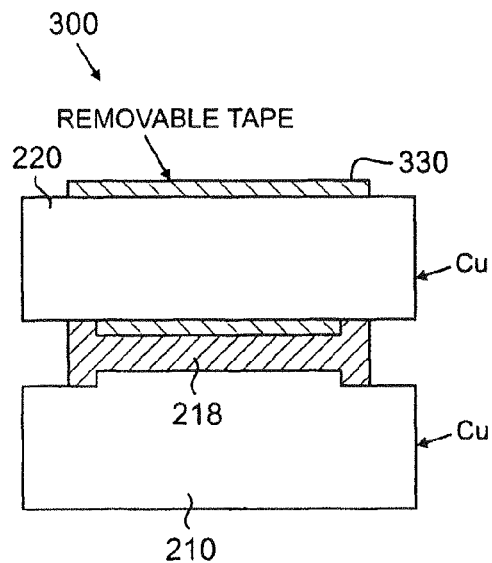
FIGS. 20a and 20b show cross-sectional and top views, respectively, of the semiconductor assembly in which a piece of removable tape is applied to the outer surface of the top heat sink.
Figure 20B:
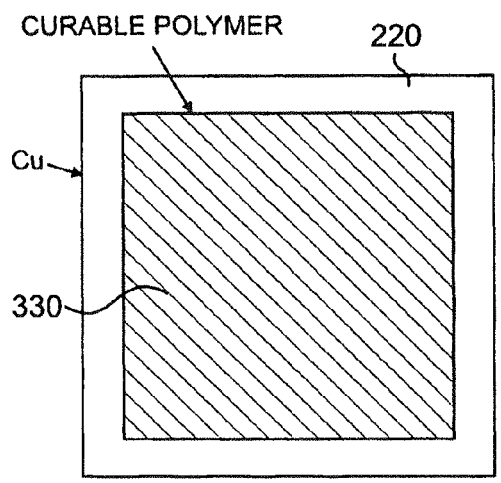
Figure 21A:
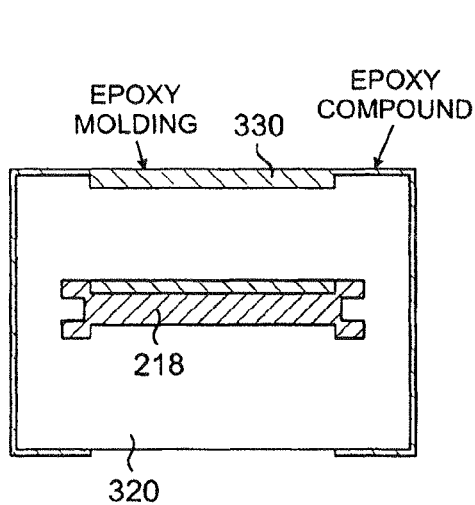
FIGS. 21a and 21b show the molding compound after it has been applied around the semiconductor assembly.
Figure 21B:
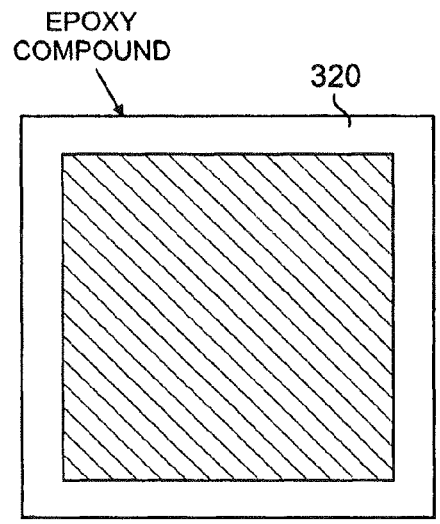
Figure 22A:
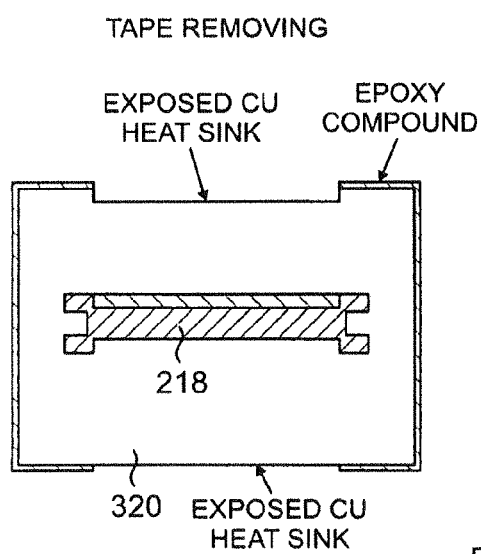
FIGS. 22a and 22b show the semiconductor assembly of FIGS. 21a and 21b after the removable tape is removed, thereby allowing the outer surface of the top heat sink to remain exposed.
Figure 22B:
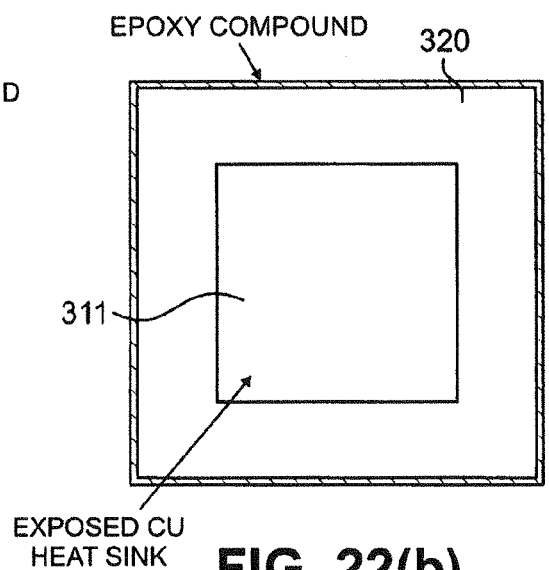

FIGS. 20-22 show an alternative embodiment of the invention in which one or more portions of the heat sinks are exposed after encapsulating the semiconductor assembly using removable tape 330. FIGS. 20(*a*) and 20(*b*) show cross-sectional and top views, respectively, of the semiconductor assembly 300. A piece of removable tape 330 is applied to the outer surface of the top heat sink 220 (i.e., the surface of the heat sink 220 remote from the die 218). Next, as shown in FIGS. 21(*a*) and 21(*b*), the molding compound 320 is once again applied around the semiconductor assembly 300, typically using an injection molding process. The removable tape 330 is then removed, thereby allowing the outer surface of the top heat sink 220 to remain exposed, as shown in FIGS. 22(*a*) and 22(*b*).

The invention claimed is:

1. A method for forming a semiconductor assembly, comprising:
    forming a first patterned polymer layer on a first surface of a first heat sink to define an exposed portion of the first surface, said exposed portion of the first surface extending radially inward along the first heat sink surface from the first patterned polymer layer;
    forming a second patterned polymer layer on a radially outer portion of the first patterned polymer layer, said first and second patterned polymer layers defining a cell for accommodating a power semiconductor die;
    applying a solder material onto the entire exposed portion of the first heat sink surface and in the cell;
    positioning a power semiconductor die within the cell on a radially inward portion of the first patterned polymer layer so that the die is thermally coupled to the first heat sink by the solder material;
    forming a packaging patterned polymer layer on top of a second surface of the first heat sink opposing the first surface and defining an interior surface portion of the first heat sink; and
    forming a semiconductor package in which the first heat sink, solder material and power semiconductor die are located such that the interior surface portion of the second surface of the first heat sink is not enclosed by the semiconductor package.

2. The method of claim 1 wherein the semiconductor package is a chip scale package.

3. The method of claim 1 wherein the power semiconductor die has a footprint with a given shape and the first patterned polymer layer conforms to the given shape.

4. The method of claim 1 further comprising:
    forming a third patterned polymer layer on a first surface of a second heat sink to define an exposed portion of the second surface, said exposed portion of the second surface of the second heat sink surface extending radially inward along the second heat sink surface from the third patterned polymer layer;
    forming a fourth patterned polymer layer on a radially outer portion of the third patterned polymer layer, said third and fourth patterned polymer layers defining a cell for accommodating the power semiconductor die;
    applying a second solder material onto the exposed portion of the second heat sink surface; and
    positioning the power semiconductor die within the cell on a radially inward portion of the patterned polymer third layer;
    forming a second packaging patterned polymer layer on a second surface of the second heat sink opposing the first surface and defining an interior surface portion of the second surface of the second heat sink; and
    wherein the semiconductor package further encloses the second heat sink such that the interior surface portion of the second surface of the second heat sink is not enclosed by the semiconductor package.

5. The method of claim 1 wherein the semiconductor package is formed by an injection molding process.

6. A method for forming a semiconductor assembly, comprising:
    forming a first patterned polymer layer on a first surface of a first heat sink to define an exposed portion of the first surface, said exposed portion of the first surface extending radially inward along the first heat sink surface from the first patterned polymer layer;
    forming a second patterned polymer layer on a radially outer portion of the first patterned polymer layer, said first and second patterned polymer layers defining a cell for accommodating a power semiconductor die;
    applying a solder material onto the exposed portion of the first heat sink surface and in the cell;
    positioning a power semiconductor die within the cell on a radially inward portion of the first patterned polymer layer so that the die is thermally coupled to the first heat sink by the solder material;
    applying removable tape onto a second surface of the first heat sink opposing the first surface of the first heat sink and defining an interior surface portion of the first heat sink;
    forming a semiconductor package in which the first heat sink, solder material and die are located; and
    removing the removable tape from the second surface of the first heat sink to thereby expose the interior surface portion of the first heat sink.

7. The method of claim 6 wherein the semiconductor package is a chip scale package.

8. The method of claim 6 wherein the power semiconductor die has a footprint with a given shape and the first patterned polymer layer conforms to the given shape.

9. The method of claim 6 further comprising:
    forming a third patterned polymer layer on a first surface of a second heat sink to define an exposed portion of the second surface, said exposed portion of the second surface of the second heat sink surface extending radially inward along the second heat sink surface from the third patterned polymer layer;

forming a fourth patterned polymer layer on a radially outer portion of the third patterned polymer layer, said third and fourth patterned polymer layers defining a cell for accommodating the power semiconductor die;

applying a second solder material onto the exposed portion of the second heat sink surface; and positioning the power semiconductor die within the cell on a radially inward portion of the third patterned polymer layer;

applying second removable tape onto a second surface of the second heat sink opposing the first surface of the second heat sink and defining an interior surface portion of the second surface of the second heat sink; and wherein the semiconductor package further encloses the second heat sink;

removing the second removable tape such that the interior surface portion of the second surface of the second heat sink is not enclosed by the semiconductor package.

10. The method of claim 6 wherein the semiconductor package is formed by an injection molding process.

* * * * *